United States Patent
Guillet De Chatellus et al.

(10) Patent No.: US 10,234,706 B2
(45) Date of Patent: Mar. 19, 2019

(54) DEVICE FOR PHOTONIC GENERATION OF ARBITRARY MICROWAVE SIGNALS HAVING LINEAR FREQUENCY MODULATION

(71) Applicants: CENTRE NATIONAL DE LA RECHERCHE SCIENTIFIQUE, Paris (FR); UNIVERSITE GRENOBLE ALPES, Saint Martin D'Heres (FR); Institut National de la Recherche Scientifique, Quebec, Québec (CA)

(72) Inventors: Hugues Guillet De Chatellus, Corenc (FR); José Azana, Montreal (CA)

(73) Assignees: CENTRE NATIONAL DE LA RECHERCHE SCIENTIFIQUE, Paris (FR); UNIVERSITE GRENOBLE ALPES, Saint Martin D'Heres (FR); INSTITUT NATIONAL DE LA RECHERCHE SCIENTIFIQUE, Quebec, Quebec (CA)

( * ) Notice: Subject to any disclaimer, the term of this patent is extended or adjusted under 35 U.S.C. 154(b) by 0 days.

(21) Appl. No.: 15/768,820

(22) PCT Filed: Oct. 20, 2016

(86) PCT No.: PCT/EP2016/075249
§ 371 (c)(1),
(2) Date: Apr. 16, 2018

(87) PCT Pub. No.: WO2017/072025
PCT Pub. Date: May 4, 2017

(65) Prior Publication Data
US 2018/0284495 A1    Oct. 4, 2018

(30) Foreign Application Priority Data
Oct. 28, 2015 (FR) ...................... 15 60294

(51) Int. Cl.
*G02F 1/125* (2006.01)
*G02F 1/11* (2006.01)
(Continued)

(52) U.S. Cl.
CPC ............. *G02F 1/125* (2013.01); *G02F 1/11* (2013.01); *G02F 1/225* (2013.01); *H01S 3/0057* (2013.01);
(Continued)

(58) Field of Classification Search
CPC .................... G02F 1/125; G02F 1/11
See application file for complete search history.

(56) References Cited

U.S. PATENT DOCUMENTS 7,650,080 B2 * 1/2010 Yap ..................... G02F 2/02
398/161
7,777,940 B1   8/2010 Delfyett et al.
(Continued)

FOREIGN PATENT DOCUMENTS

CN   102 255 224 A   11/2011

OTHER PUBLICATIONS

Jianping Yao, "Microwave Photonics," Journal of Lightwave Technology, vol. 27, No. 3, Feb. 1, 2009, pp. 314-335.
(Continued)

*Primary Examiner* — Sung H Pak
(74) *Attorney, Agent, or Firm* — Baker & Hostetler LLP

(57) ABSTRACT

Photonic devices for generating linearly frequency modulated arbitrary microwave signals comprise a laser, and assembly for forming the emitted signal and a photoreceiver the passband of which is in the domain of the microwave frequencies. The forming assembly comprises: a first beam splitter; a first optical channel including a frequency-shifting loop comprising a beam splitter, a first optical amplifier, an optical isolator, a first spectral optical filter and an acousto- (Continued)

optical frequency shifter; a second optical channel including an electro-optical frequency shifter; a second beam splitter; a second optical amplifier; and a second optical filter; the acousto-optical frequency shift, the electro-optical frequency shift and the amplification gain of the first optical amplifier being adjustable.

11 Claims, 3 Drawing Sheets

(51) Int. Cl.
G02F 1/225 (2006.01)
H01S 3/00 (2006.01)
H03B 17/00 (2006.01)
H03B 23/00 (2006.01)

(52) U.S. Cl.
CPC ........... *H01S 3/0085* (2013.01); *H03B 17/00* (2013.01); *H03B 23/00* (2013.01); *G02F 2201/20* (2013.01); *G02F 2201/205* (2013.01); *G02F 2203/13* (2013.01); *G02F 2203/54* (2013.01)

(56) References Cited

U.S. PATENT DOCUMENTS

| | | | | |
|---|---|---|---|---|
| 9,967,031 | B1* | 5/2018 | Middleton | H04B 10/00 |
| 2005/0259997 | A1* | 11/2005 | Sternklar | H04B 10/505 |
| | | | | 398/186 |
| 2007/0121686 | A1* | 5/2007 | Vaissie | H01S 3/0057 |
| | | | | 372/27 |
| 2007/0189341 | A1 | 8/2007 | Belsley | |

OTHER PUBLICATIONS

H. Guillet de Chatellus et al., "Generation of ultrahigh and tunable repetition rates in CW injection seeded frequency shifted feedback lasers," Optics Express, vol. 21, No. 13, Jul. 1, 2013, pp. 15065-15074.

H. Guillet de Chatellus et al., "Theory of Talbot lasers," Physical Review A, American Physical Society, vol. 88, 2013, pp. 33828.

* cited by examiner

OPTICAL SIGNAL
MODULATOR OUTPUT

OPTICAL SIGNAL
DISPERSIVE LINE OUTPUT $f_S/f_C = a-\varepsilon$ $f_S/f_C = a+\varepsilon$

DEVICE FOR PHOTONIC GENERATION OF ARBITRARY MICROWAVE SIGNALS HAVING LINEAR FREQUENCY MODULATION

CROSS REFERENCE TO RELATED APPLICATIONS

This application is a National Stage of International patent application PCT/EP2016/075249, filed on Oct. 20, 2016, which claims priority to foreign French patent application No. FR 1560294, filed Oct. 28, 2015, the disclosures of which are incorporated by reference in their entirety.

FIELD OF THE INVENTION

The field of the invention is that of photonic generation of microwave signals and more specifically of microwave signals that are linearly frequency modulated, also referred to as "LFM" signals. These LMF signals are also referred to as "arbitrary" signals. In the rest of the text, the term LFM designates the temporal form of the signal. Such signals are also said to be "chirped". These signals are characterized by their central or average frequency, sometimes referred to as their carrier frequency, and by their passband. The latter is conventionally defined as the difference between the highest frequency and lowest frequency of the signal. In the present case, the carrier frequency is comprised between 1 GHz and 100 GHz and the passband between 0 and 200 GHz.

BACLGROUND

The fields of application of this type of microwave signals are many and diverse. Mention will be made, by way of example, of the field of radar, the field of biomedical imaging, the health field, the field of spectroscopy and, lastly, the field of characterization of radiofrequency components.

Pulse-compression radar allow a very good spatial resolution that is shorter than the length corresponding to the pulse duration to be obtained. Thus, drawbacks related to the generation, amplification and emission of short and intense pulses are avoided. The signals emitted by these pulse-compression radar are linearly frequency modulated microwave signals. The same goes for the radar known by the acronym "FMCW", meaning "Frequency Modulation Continuous Wave". This type of radar may in particular be used, in the health field, to monitor, contactlessly, physiological parameters such as cardiac rhythm.

In biomedical imaging, linearly frequency modulated microwave signals allow properties of biological tissues to be determined via measurement of their dielectric permittivity. In addition, it is possible to work with signals of low energy.

These signals are also particularly well-suited to the spectroscopy of macromolecules in the gaseous state, such as amino acids or peptide chains.

Lastly, it is possible to use these signals to characterize radiofrequency components of all types. Present day equipment of the "SNA", acronym meaning "Scalar Network Analyzer", or "VNA", acronym meaning "Vector Network Analyzer", type that perform this type of characterization are generally heavy and expensive pieces of equipment.

Conventionally, arbitrary signals are created using arbitrary waveform generators (AWGs). However, their passband is limited by the analog-to-digital converters to 40-100 GHz. Moreover, the use of AWGs is limited by their cost, the fluctuation in the emission times of the signals or "temporal jitter", and the bulk and electrical power consumption of these pieces of apparatus.

More specifically, arbitrary signals are generated using a simple "VCO", acronym meaning "Voltage Controlled Oscillator", that generates a frequency signal that is proportional to the input voltage. The main drawback of this technique is that the passbands obtained are limited to a few GHz. Moreover, with this type of generator other microwave sources may lead to parasitic signals.

With a view to overcoming the intrinsic limitations on the passband of electronic systems, due to the speed of their analogue-digital converters, a new field of research, called microwave photonics, has developed over the last decade or so. The reader is referred to the article by J. Yao entitled "Microwave photonics", J. Lightwave Tech. (2009) for additional information on this technique. The principle is to use the very large passband of fiber-based optical systems, which may be larger than 10 THz, then to convert this passband to the microwave-frequency domain. To give a simple example, the beating of two fiber lasers on a photodetector produces a microwave signal the frequency of which is equal to the difference in the optical frequencies of the two lasers. Thus, a signal is obtained in the GHz-THz range. Moreover, optical techniques are insensitive to electromagnetic interference, have a low electrical power consumption and a small bulk. Lastly, the spectral purity of optical pulse trains, which is in general related to the mechanical stability of laser cavities, allows an amount of temporal jitter smaller than that of electronic methods to be obtained.

To generate LFM signals at frequencies higher than one GHz, a plurality of photonics solutions have been proposed.

The first solution is to use the technique referred to as "FTTM", acronym meaning "Frequency To Time Mapping", in dispersive optical lines. A mode-locked femtosecond or picosecond laser generates a brief wide-optical-spectrum pulse. A frequency filter imprints a chirp modulation on the spectrum of the signal. The left-hand part of FIG. 1 shows the amplitude A of this pulse as a function of time t and as a function of frequency f. This pulse is passed to what is called a GVD dispersive line, GVD being the acronym of "Group Velocity Dispersion". At the exit of the dispersive line, the temporal form of the pulse reproduces the spectral form of the pulse, as may be seen in the right-hand part of FIG. 1. An LFM signal or chirp is thus generated. As a variant, this type of optical signal can be produced using an incoherent source. This solution suffers from a certain complexity.

A variant of this first technical solution consists in modulating the spectrum with a cosine function, then in making it propagate through a medium the dispersion of which is non-linear. This medium may be a Bragg grating that is "chirped" nonlinearly. This technique has a plurality of limitations. It is possible neither to obtain wide passbands, nor to easily modify the duration of the signal or to generate variations in frequency that increase with time.

A second variant consists in modulating the optical spectrum in a dispersive interferometer. The laser pulse, which is stretched beforehand, is injected into an interferometer in which the two arms have different group-velocity dispersions. On exiting, the spectrum contains peaks and valleys the spacing of which varies linearly, this resulting, in the time domain, in a linear frequency modulation of the light intensity of the pulse. This technique has certain advantages over the preceding solutions. However, the system still requires a mode-locked laser and the duration of the LFM is not easily adjustable.

In a third variant, the pulse generated by the laser is modulated not only in amplitude, but also in phase. This technique allows large passbands to be obtained but still has substantial drawbacks. The repetition rate remains limited, and the duration and direction of the frequency variation are not adjustable. The means to be implemented, in particular the femtosecond laser and the modulator remain complex and expensive.

A second technical solution for generating LFM microwave signals consists in using two lasers. In a first configuration, the first laser emits a single-frequency continuous-wave signal and the pulse of the second laser undergoes a linear frequency modulation. The beating of these two lasers on a photodetector reproduces the optical linear frequency modulation in the microwave domain. The advantages of this technique are a relative simplicity and the ability to adjust the duration of the signal, the range of variation of its central frequency and its passband. In contrast, the linearity of the linear frequency modulation of the laser is problematic for large passbands.

One variant of this second solution consists in propagating a short pulse emitted by the first laser through a dispersive medium so as to disperse the frequencies contained in the pulse. The dispersed pulse is then recombined with the second laser. This technique achieves an attractive level of performance at the price of a higher technical complexity, a high cost and decreased flexibility. One variant of this technique consists in beating two lasers that have undergone two different dispersive propagations and therefore two different optical chirps.

However, despite their flexibility, because of the absence of possible frequency and a fortiori phase stabilization between the two lasers, techniques using two lasers are unacceptable for applications in which a high reproducibility of the signal is necessary and in particular for radar applications in which pulse-to-pulse coherence is necessary.

SUMMARY OF THE INVENTION

More precisely, the subject of the invention is a photonic device for generating linearly frequency modulated arbitrary microwave signals, said device comprising, in this order, a laser that emits a continuous-wave signal at a first optical frequency, an assembly for spectrally and temporally forming said continuous-wave signal and a photoreceiver the passband of which is in the domain of the microwave frequencies, characterized in that the spectrally and temporally forming assembly includes at least:

a first Y-junction beam splitter placed at the exit of the laser;

a first optical channel placed at the exit of the first branch of the first Y-junction beam splitter, said first optical channel being a frequency-shifting loop, said frequency-shifting loop comprising an X-junction beam splitter, a first optical amplifier, a first optical filter, an optical isolator and an acousto-optical frequency shifter, which are placed between two branches of the X-junction beam splitter;

a second optical channel placed at the exit of the second branch of the first Y-junction beam splitter, said second optical channel including an electro-optical frequency shifter;

a second Y-junction beam splitter the first branch of which is placed at the exit of the first optical channel and the second branch of which is placed at the exit of the second optical channel;

a second optical amplifier placed at the common exit of the second Y-junction beam splitter; and a second optical filter placed between the exit of the second optical amplifier and the photoreceiver;

at least the acousto-optical frequency shift, the electro-optical frequency shift and the amplification gain of the first optical amplifier being adjustable.

Advantageously, all or some of the device is fiber-based, the laser being fiber-based, the first Y-junction beam splitter being a first Y-junction optical coupler, the second Y-junction beam splitter being a second Y-junction optical coupler and the X-junction beam splitter being an X-junction optical coupler.

Advantageously, all or some of the device is produced in integrated-optics technology.

Advantageously, all or some of the device is produced by means of discrete optical components, the first Y-junction beam splitter being a first cube splitter including a half-silvered mirror, the second Y-junction beam splitter being a second cube splitter including a half-silvered mirror and the X-junction beam splitter being a cube splitter including a half-silvered mirror.

Advantageously, the first optical filter is of optical passband type.

Advantageously, the second optical filter is a spectral filter of optical passband type, or an intensity-modulating filter.

Advantageously, the product of multiplying the acousto-optical frequency shift by the time taken by light to transit the frequency-shifting loop is substantially equal to an integer number or to a fractional number.

Advantageously, the acousto-optical frequency shift is comprised between 1 and 300 MHz.

Advantageously, the electro-optical frequency shifter is a single-sideband modulator.

Advantageously, the electro-optical frequency shift is comprised between −40 GHz and +40 GHz.

Advantageously, the gain of the first amplifier is at least sufficient to compensate for optical losses in the X-junction beam splitter, the optical isolator, the acousto-optical frequency shifter and the spectral optical filter.

BRIEF DESCRIPTION OF THE DRAWINGS

The invention will be better understood and other advantages will become apparent on reading the following non-limiting description and by virtue of the appended figures, in which.

DETAILED DESCRIPTION

The photonic device for generating microwave signals according to the invention may be produced either in a "fiber-based" or "integrated-optics" configuration, the frequency-shifting loop consisting of optical fibers or waveguides; or in a "free-space" configuration with discrete optical components, the frequency-shifting loop being produced with correctly aligned mirrors. The expression "free-space configuration" is understood to mean a configuration in which the optical beams propagate entirely or partially through free space.

Figure 1:
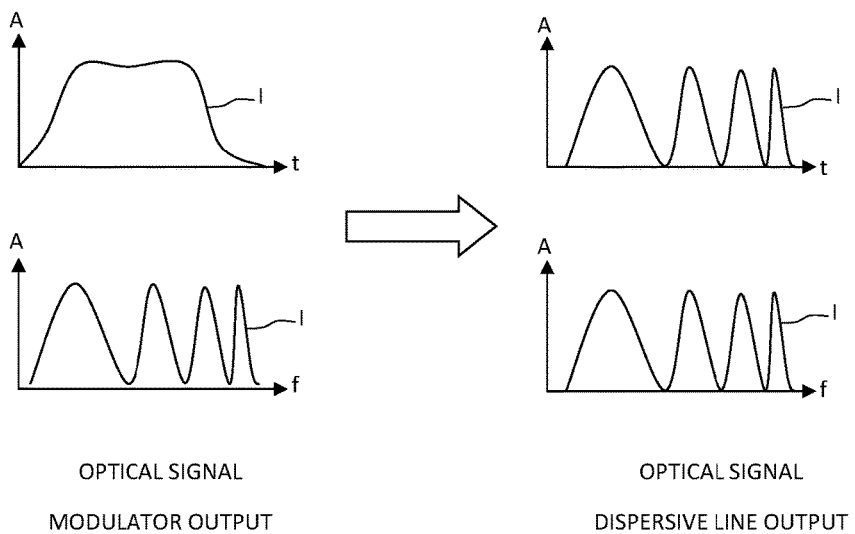
FIG. 1, which has already been commented on, is an illustration of the prior-art technique referred to as "FTTM", acronym meaning "Frequency To Time Mapping", for generating linearly frequency modulated microwave signals in dispersive lines.
Figure 2:
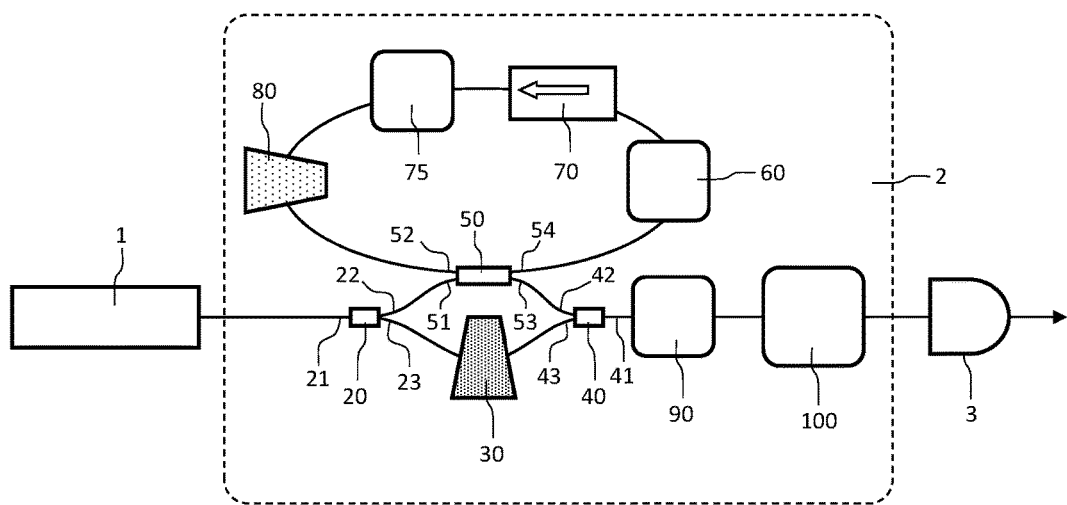
FIG. 2 shows a general diagram of a photonic device for generating linearly frequency modulated arbitrary microwave signals according to the invention including a frequency-shifting loop.

A diagram of the "fiber-based" version of a photonic device for generating linearly frequency modulated arbitrary microwave signals according to the invention is shown in FIG. 2. It is this version that is detailed below. However, each time there is a significant difference between the fiber-based version and the free-space version, it is indicated.

Figure 3:
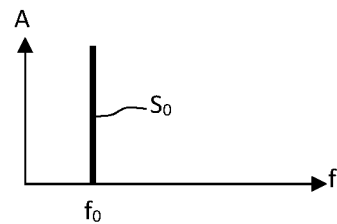
FIG. 3 shows the initial signal as a function of frequency in a device according to the invention.

The photonic generating device of FIG. 2 comprises in this order:

a laser emitting a continuous-wave signal So at a first optical frequency denoted $f_0$. This frequency is in the domain of a few hundred THz. This laser may advantageously be a fiber laser emitting in the "telecom" frequency range i.e. at about 1550 nm. It must possess a small line width of about a few kHz and emit a power of a few mW. Other wavelengths are possible, in particular in the vicinity of 780 nm or 1 μm but fiber-based components for these wavelengths are more expensive. The amplitude A of this signal $S_O$ as a function of frequency f is shown in FIG. 3. The use of a single laser has a major advantage over the preceding technologies insofar as pulse-to-pulse coherence is ensured automatically;

an assembly 2 for spectrally and temporally forming said continuous-wave signal; and a photoreceiver 3 the passband of which is in the microwave-frequency domain.

The spectrally and temporally forming assembly 2 includes at least:

a first Y-junction beam splitting device 20. In the case in FIG. 2, this splitter is an optical coupler. In a free-space embodiment, this coupler is a plate splitter or a cube splitter. This splitter includes an entrance 21 and two exit branches 22 and 23. The entrance 21 is coupled to the laser 1, the exit 22 is coupled to the first optical channel and the exit 23 to the second optical channel; and a first optical channel placed at the exit of the first branch 22 of the first coupler 20. This first optical channel is a frequency-shifting loop. It comprises an X-junction beam splitting device 50, a first optical amplifier 60, an optical isolator 70, a first optical spectral filter 75 and an acousto-optical frequency shifter 80.

The X-junction beam splitter 50 may be an four-channel optical-fiber optical coupler or a beam splitter produced by means of a half-silvered mirror. The X-junction coupler 50 includes two entrance channels 51 and 52 and two exit channels 53 and 54. The entrance 51 is coupled to the exit 22 of the Y-junction coupler.

The amplifier 60, the isolator 70, the spectral filter 75 and the acousto-optical shifter 80 are mounted in series between the exit 54 and the entrance 52 of the X-junction coupler. The amplifier 60 has a gain denoted G, the total optical loss in the first channel due to the various optical couplings and to losses in the isolator and the acousto-optical shifter 80 is denoted P.

The role of the optical isolator 70 is to force the light generated by the laser to propagate in a single direction, thus preventing parasitic waves from circulating in the opposite direction and disrupting operation of the system.

The main purpose of the first optical spectral filter 75 is to limit noise due to amplified spontaneous emission and secondarily, to make it possible to select the passband of the loop and therefore to control the spectral width of the frequency-modulated signal. This programmable optical filter is based on a Bragg grating that is photo-inscribed in an optical fiber, or indeed on a diffractive element or optical grating allowing the spectrum of the light to be accessed in the Fourier plane of the device. A programmable amplitude filter, conventionally a liquid-crystal matrix, placed in this Fourier plane allows the various frequencies of the light to be selectively attenuated and therefore its spectrum to be modulated. A second pass through the grating allows the light to be re-collimated after modulation of its spectrum, and it to be reinjected either into the free-space loop, or into an optical fiber in the case of a fiber-based configuration.

The acousto-optical shifter 80 uses diffraction of the light wave by a travelling acoustic wave in a transparent solid. The acousto-optical frequency shift $f_S$ is comprised between 1 and 300 MHz. This frequency range is completely normal for this type of device.

The inverse of the transit time through the frequency-shifting loop is called $f_C$. In the case of a fiber-based configuration, if the length of the frequency-shifting loop is 10 meters, the frequency $f_C$ of this loop is equal to 30 MHz. This frequency is 10 MHz for a loop length of 30 meters. The order of magnitude of this frequency is equivalent to that of the acousto-optical frequency shift $f_S$. These orders of magnitude of the loop length are naturally those that are obtained using erbium-doped fiber amplifiers 60. In the case of a free-space configuration, the length of the loop may be significantly smaller, a few tens of centimeters to a few meters. The values of $f_C$ are then higher and vary between 100 MHz and 1 GHz.

A second optical channel is placed at the exit of the second branch 23 of the first Y-junction splitting device. This second optical channel includes an electro-optical frequency shifter 30. This frequency shifter is preferably a single-sideband modulator. This shifter conventionally uses two Mach-Zehnder interferometers each containing one electro-optical modulator. By correctly adjusting the voltages of the electro-optical modulators so as to make both the carrier and one of the two sidebands interfere destructively, a single sideband is obtained as output: this device therefore operates as a frequency shifter. The electro-optical frequency shift $f_e$ is comprised between −40 GHz and +40 GHz in a fiber-based configuration. This frequency range is completely normal for this type of device.

A second Y-junction beam splitting device 40. This splitter includes two entrance branches 42 and 43 and a single exit 41. Once again, this splitter may be a fiber-based optical coupler or a half-silvered mirror. The first entrance branch 42 is coupled to the exit 53 of the X-junction coupler of the first channel, the second entrance exit branch 43 is coupled to the exit of the electro-optical frequency shifter 30.

A second optical amplifier 90 placed at the common exit 41 of the second Y-junction beam splitter.

A second optical filter 100 placed between the exit of the second optical amplifier 90 and the photoreceiver 3. This filter may be a programmable filter that operates on the same principle as the spectral filter 75. Of course, the filtering band of the optical filter must be compatible with the optical frequency $f_0$. Alternatively, because of the linear relationship between time and instantaneous frequency in the case of linearly frequency modulated signals, this filter may also be an intensity modulator, allowing the intensity of the light signal to be controlled as a function of time at the exit of the loop. In general, this intensity modulator is based either on an acousto-optical modulator, or on electro-optical modulation. The latter type of modulation may itself be based on rotation of polarization using the Pockels effect, or on an interference effect in a Mach-Zehnder interferometer.

At least the acousto-optical frequency shift $f_S$, the electro-optical frequency shift $f_e$ and the amplification gain G of the first optical amplifier are adjustable. The frequency $f_S$ is for example adjusted by means of a radio frequency generator.

The operation of the photonic generating device is detailed below.

A first portion of the beam emitted at the frequency $f_0$ is introduced into the frequency-shifting loop. Its operation is as follows. Each time the beam makes a complete pass through the loop and returns to the entrance 52 of the X-junction coupler, one portion of the beam is reinjected into the loop by the X-junction coupler and the second portion exits from the loop and passes to the optical amplifier 90. At the exit 53 of the X-junction coupler, an optical signal $S_1$ composed of a succession of optical signals $S_{1k}$ that have passed a certain number k of times through the loop is therefore obtained.

Figure 4:
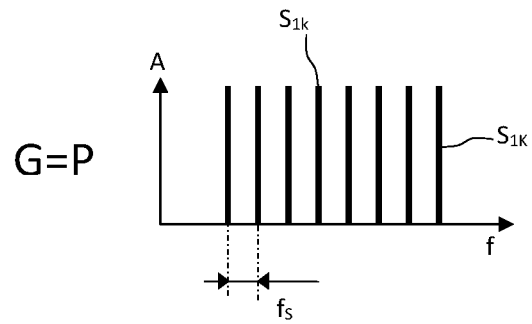
FIG. 4 shows a first signal as a function of frequency at the exit of the frequency-shifting loop in a device according to the invention.
Figure 5:
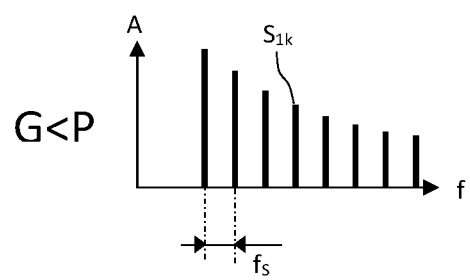
FIG. 5 shows a second signal as a function of frequency at the exit of the frequency-shifting loop in a device according to the invention.

Each signal $S_{1k}$ is characterized by its amplitude, its frequency and its phase. FIGS. 4 and 5 show the amplitudes of the succession of signals $S_{1k}$ as a function of frequency. The amplitude of the signal $S_{1k}$ depends on the gain of the optical amplifier 60, on the first optical filter 75 and on the losses in the loop. If the gain just compensates for the losses, all the signals $S_{1k}$ have the same amplitude, as may be seen in FIG. 4. If the gain is lower than the losses, the amplitude of the signals $S_{1k}$ rapidly decreases as may be seen in FIG. 5.

Each time the light passes through the acousto-optical frequency shifter 80, its frequency is increased by an amount $f_S$. Thus, the signal $S_{1k}$ has a frequency equal to $f_0+k.f_S$, as may be seen in FIGS. 4 and 5.

On account of the iterative effect in the loop, the various frequencies may be demonstrated to have a quadratic dependency on their phase. More precisely, the phase $\varphi_{1k}$ of the signal $S_{1k}$ of frequency $f_0+k.f_S$ respects the relationship:

$$\varphi_{1k}=\pi.k.(k+1).f_S/f_C$$

The reader is referred to the articles by H. Guillet de Chatellus et al., entitled "Generation of ultrahigh and tunable repetition rates in CW injection seeded frequency shifted feedback lasers", Opt. Exp. 21, 15065 (2013) and "Theory of Talbot lasers", Phys. Rev A 88, 033828 (2013) for further information on this calculation.

The optical signal $S_1$ is therefore equivalent to an optical-frequency comb that has undergone a certain group-velocity dispersion that corresponds to the quadratic spectral phase.

In the time domain, this optical signal consists of a train of identical light pulses of period $1/f_S$. Each pulse possesses a linear frequency modulation in the optical-frequency domain, the minimum and maximum frequencies of which are $f_0$ and $f_0+K.f_S$, where K is the maximum number of roundtrips that the light makes in the loop or, equivalently, the number of frequencies present in the optical-frequency comb at the exit of the loop.

Moreover, the equivalent dispersion is proportional to the curvature of the parabola of the phases, i.e. $f_S/f_C$. The latter parameter is easily controllable by adjusting the acousto-optical frequency shift $f_S$. As may be seen from the expression of the phase $\varphi_{1k}$, it is advantageous to choose the ratio $f_S/f_C$ quite close to an integer value, or to a ratio of two integers p/q where q is lower than K.

When this ratio is exactly equal to an integer value, the equivalent dispersion is zero. All the spectral components are in phase and the loop emits short pulses, the temporal limit being given by the Fourier transform of the frequency comb. In the case where this ratio is equal to a ratio of integers p/q, with q<K, the loop emits short pulses of the same duration as in the case of the integer ratio but at a repetition rate or number of pulses per second equal to $q*f_S$. A description and explanation of this effect are given in the two articles cited above.

In contrast, when this ratio diverges from an integer or fractional value, the optical pulse widens in the time domain and the direction of variation of its linear frequency modulation changes. Specifically, it is known that phase shifts in the spectral domain correspond to time shifts in the time domain. A high diversity of phases in the spectral domain therefore corresponds to a widening of the resulting pulse in that time domain.

Figure 6:
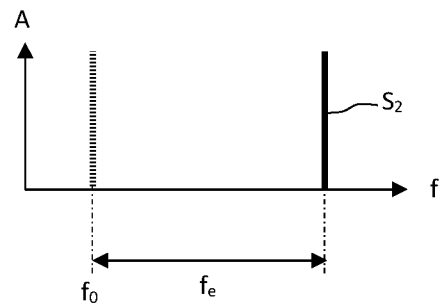
FIG. 6 shows the signal as a function of frequency output from the electro-optical frequency shifter in a device according to the invention.

A second portion of the beam emitted at the frequency $f_0$ is introduced into the electro-optical frequency shifter 30. At the exit of the frequency shifter 30, an optical signal $S_2$ the frequency of which is equal to $f_0+f_e$ is obtained. The amplitude of this signal $S_2$ as a function of frequency is shown in FIG. 6. The Y-junction coupler 40 receives, on these two entrances 42 and 43, the signals $S_1$ and $S_2$ output by the frequency-shifting loop and the electro-optical shifter, respectively, and recombines them. This recombined signal therefore includes an optical frequency centered on $f_0+f_e$ and an optical-frequency comb extending from $f_0$ to $f_0+K.f_S$.

Figure 7:
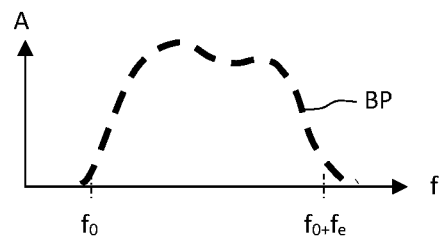
FIG. 7 shows the transmission curve of the first optical filter as a function of frequency in a device according to the invention.

The recombined signal is amplified by the optical amplifier 90, filtered by the filter 100 and received by the photodetector 3. The latter amplified and filtered optical signal is denoted $S_3$. FIG. 7 shows the passband BP of the programmable filter 100, this passband being induced either by spectral filtering or by temporal modulation of the signal output from the loop, depending on the solution employed. It is also possible to replace the spectral filter 100 with an intensity modulator. Specifically, because of the linear relationship between frequency and time, a temporal modulation of the intensity of the pulse, synchronized with the pulse train, is equivalent to spectral filtering with the filter 100. Even though it is more complex to implement insofar as it requires very precise synchronization of the modulation signal with the pulse train, temporal modulation of the intensity allows a limitation of the spectral filter, namely its resolution, which is higher than 10 GHz for commercial devices of the "waveshaper" type, to be overcome.

Figure 8:
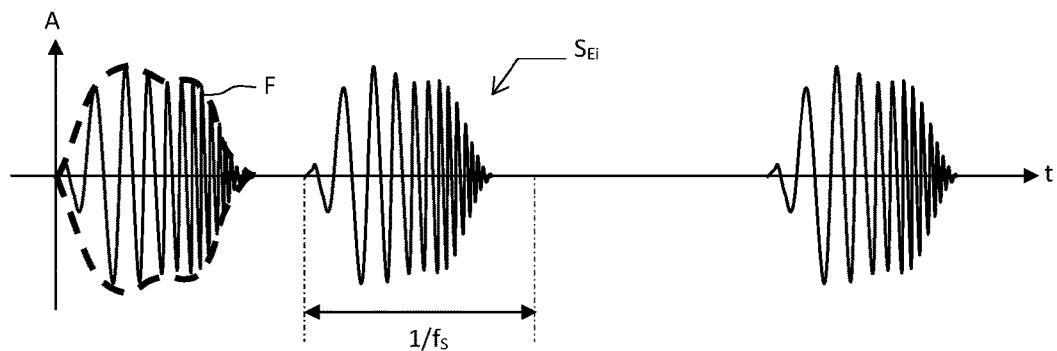
FIG. 8 shows the periodic signal as a function of time output from the photoreceiver in a device according to the invention, in the case where the ratio $f_S/f_c$ is close to a ratio of integers.

The electrical signal $S_e$ at the exit of the photodetector 3 consists of a periodic train of signals $S_{Ei}$. Its time period is equal to $1/f_S$ when the ratio $f_S/f_C$ is an integer or $1/(qf_s)$ when this ratio is equal to p/q, p and q being integers and q being lower than K. This train is shown in FIG. 8 for the case of an integer ratio. In this case, the signals $S_{Ei}$ are then identical. Each signal has an instantaneous frequency that varies over time as may be seen in FIG. 8. It will be noted that, in this figure and the following two figures, the signal includes, for the sake of clarity, a small number of periods. Real signals generally have a much larger number of periods.

The passband of the signal is given by the spectral width of the optical signal $S_3$. It is limited by the passband of the filter 100 and by the spectral width of the signal $S_1$ circulating in the frequency-shifting loop. As was described above, the passband is dependent on the gain of the optical amplifier 60, on the spectral optical filter 75 and on the losses in the loop. The central frequency is related to the optical frequency $f_0+f_e$ of the signal $S_2$. It is thus possible to achieve microwave frequencies of the order of 100 GHz.

Figure 9:
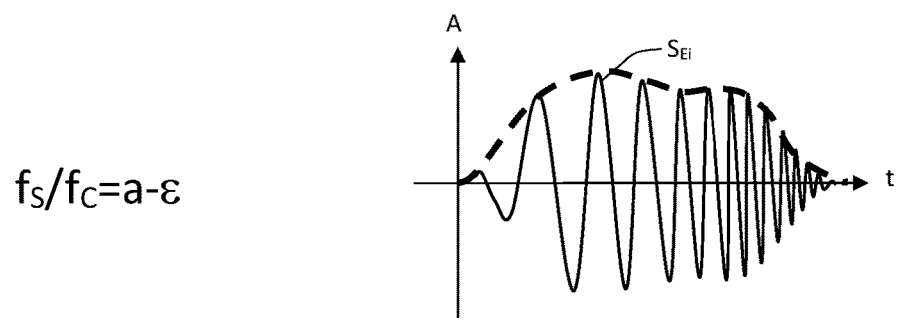
FIGS. 9 and 10 show the signal as a function of time and as a function of the frequency shift in a device according to the invention.
Figure 10:
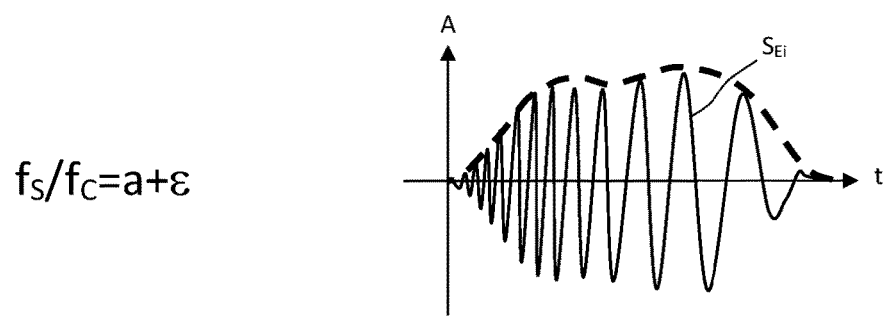

It is also possible to modify the direction of variation of the linear frequency modulation by modifying the frequency $f_S$. It is known that the direction of variation of the linear frequency modulation changes when the ratio $f_S/f_C$ is changed so as to pass from an integer or a ratio of integers. FIGS. 9 and 10 illustrate this property. They show the amplitude A of the elementary signal $S_{Ei}$ as a function of time.

If a is an integer number or a ratio of integers p/q (q<N), then the difference between the value of a and the closest integer or ratio of integers is called ε.

When ε is zero, the output signal consists of Fourier-transform-limited pulses and it is no longer linearly frequency modulated.

When ε is not zero, it is possible to show that the duration of the LFM signal is approximately about $ε*K/f_S$, where K is the total number of frequencies in the frequency comb output from the loop. Thus, when ε=+/−1/K, the duration of the LFM signal is $1/f_S$. Therefore, the range of variation in ε that is of interest is between −1/K and +1/K.

When the ratio $f_S/f_C$ is slightly lower than a, i.e. when ε is negative, the linear frequency modulation of the elementary signal $S_{Ei}$ starts, in the time domain, with low frequencies and ends with high frequencies, and when the ratio $f_S/f_C$ is slightly higher than a, i.e. when ε is positive, the linear frequency modulation of the elementary signal $S_E$ starts, in the time domain, with high frequencies and ends with low frequencies.

By way of example, for a signal $S_{Ei}$ of 12 ns period including frequencies in a range comprised between 0 and 30 GHz, a frequency variation $f_S$ of only 80 kHz is enough to modify the direction of the modulation.

The invention claimed is:

1. A photonic device for generating linearly frequency modulated arbitrary microwave signals, said device comprising, in this order, a laser that emits a continuous-wave signal at a first optical frequency, an assembly for spectrally and temporally forming said continuous-wave signal and a photoreceiver the passband of which is in the domain of the microwave frequencies, wherein the spectrally and temporally forming assembly includes at least:
a first Y-junction beam splitter placed at the exit of the laser;
a first optical channel placed at the exit of the first branch of the first Y-junction beam splitter, said first optical channel being a frequency-shifting loop, said frequency-shifting loop comprising an X-junction beam splitter, a first optical amplifier, a first optical filter, an optical isolator and an acousto-optical frequency shifter, which are placed between two branches of the X-junction beam splitter;
a second optical channel placed at the exit of the second branch of the first Y-junction beam splitter, said second optical channel including an electro-optical frequency shifter;
a second Y-junction beam splitter the first branch of which is placed at the exit of the first optical channel and the second branch of which is placed at the exit of the second optical channel;
a second optical amplifier placed at the common exit of the second Y-junction beam splitter; and
a second optical filter placed between the exit of the second optical amplifier and the photoreceiver;
at least the acousto-optical frequency shift, the electro-optical frequency shift and the amplification gain of the first optical amplifier being adjustable.

2. The photonic device for generating arbitrary microwave signals as claimed in claim 1, wherein all or some of the device is fiber-based, the laser being fiber-based, the first Y-junction beam splitter being a first Y-junction optical coupler, the second Y-junction beam splitter being a second Y-junction optical coupler and the X-junction beam splitter being an X-junction optical coupler.

3. The photonic device for generating arbitrary microwave signals as claimed in claim 1, wherein all or some of the device is produced in integrated-optics technology.

4. The photonic device for generating arbitrary microwave signals as claimed in claim 1, wherein all or some of the device is produced by means of discrete optical components, the first Y-junction beam splitter being a first cube splitter including a half-silvered mirror, the second Y-junction beam splitter being a second cube splitter including a half-silvered mirror and the X-junction beam splitter being a cube splitter including a half-silvered mirror.

5. The photonic device for generating arbitrary microwave signals as claimed in claim 1, wherein the first optical filter is of optical passband type.

6. The photonic device for generating arbitrary microwave signals as claimed in claim 1, wherein the second optical filter is either a spectral filter of optical passband type, or an intensity-modulating filter.

7. The photonic device for generating arbitrary microwave signals as claimed in claim 1, wherein the product of multiplying the acousto-optical frequency shift by the time taken by light to transit the frequency-shifting loop is substantially equal to an integer number or to a fractional number.

8. The photonic device for generating arbitrary microwave signals as claimed in claim 1, wherein the acousto-optical frequency shift is comprised between 1 and 300 MHz.

9. The photonic device for generating arbitrary microwave signals as claimed in claim 1, wherein the electro-optical frequency shifter is a single-sideband modulator.

10. The photonic device for generating arbitrary microwave signals as claimed in claim 1, wherein the electro-optical frequency shift is comprised between −40 GHz and +40 GHz.

11. The photonic device for generating arbitrary microwave signals as claimed in claim 1, wherein the gain of the first amplifier is at least sufficient to compensate for optical losses in the X-junction beam splitter, the optical isolator and the acousto-optical frequency shifter.

* * * * *